United States Patent
Fay et al.

(10) Patent No.: US 10,573,492 B2
(45) Date of Patent: Feb. 25, 2020

(54) CALIBRATION OF ELEMENTARY SMALL PATTERNS IN VARIABLE-SHAPED-BEAM ELECTRON-BEAM LITHOGRAPHY

(71) Applicant: COMMISSARIAT A L'ENERGIE ATOMIQUE ET AUX ENERGIES ALTERNATIVES, Paris (FR)

(72) Inventors: Aurélien Fay, Coublevie (FR); Jacky Chartoire, Aix en Provence (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 78 days.

(21) Appl. No.: 16/019,392

(22) Filed: Jun. 26, 2018

(65) Prior Publication Data
US 2018/0374677 A1    Dec. 27, 2018

(30) Foreign Application Priority Data
Jun. 27, 2017 (FR) ..................... 17 55863

(51) Int. Cl.
*H01J 37/317* (2006.01)

(52) U.S. Cl.
CPC . *H01J 37/3174* (2013.01); *H01J 2237/24592* (2013.01); *H01J 2237/30433* (2013.01);
(Continued)

(58) Field of Classification Search
CPC ......... H01J 37/3174; H01J 2237/31769; H01J 2237/31776; H01J 2237/30433; H01J 2237/24592
See application file for complete search history.

(56) References Cited

U.S. PATENT DOCUMENTS 5,759,423 A * 6/1998 Sohda .................... B82Y 10/00
216/45
2004/0267471 A1* 12/2004 Enichen ................. B82Y 10/00
702/81

(Continued)

FOREIGN PATENT DOCUMENTS

DE    10 2009 049 787 A1    4/2011
EP        3 121 833 A1        1/2017

OTHER PUBLICATIONS

Pfeiffer, "Recent Advances in Electron-Beam Lithography for the High-Volume Production of VLSI devices", IEEE transaction on electron devices, vol. 26, Issue 4, pp. 663-674, (1979).
(Continued)

*Primary Examiner* — Michael C Bryant
(74) *Attorney, Agent, or Firm* — Baker & Hostetler LLP

(57) ABSTRACT

A method for calibrating elementary patterns in variable-shaped-beam electron-beam lithography, includes the following steps: producing, by variable-shaped-beam electron-beam lithography, a calibration pattern comprising geometric figures each having a nominal critical dimension, the figures being divided into elementary patterns of smaller dimensions than each the nominal critical dimension; measuring the actual critical dimension of each the geometric figure; and applying a regression method on the basis of the actual critical dimensions thus determined to construct a mathematical model expressing either a variation in dimensions of the elementary patterns, or an error in the exposure dose of the elementary patterns producing an equivalent effect to the variation in dimensions, as a function of the dimensions of the elementary patterns. Application to the preparation of data with a view to transferring a pattern to a substrate by variable-shaped-beam electron-beam lithography.

15 Claims, 8 Drawing Sheets

(52) U.S. Cl.
CPC .............. *H01J 2237/31769* (2013.01); *H01J 2237/31776* (2013.01)

(56) References Cited

U.S. PATENT DOCUMENTS

| | | |
|---|---|---|
| 2007/0114453 A1 | 5/2007 | Emi et al. |
| 2007/0194250 A1 | 8/2007 | Suzuki et al. |
| 2018/0374677 A1* | 12/2018 | Fay .................... H01J 37/3174 |

OTHER PUBLICATIONS

Nishimura, et al., "Evaluation of Shaping Gain Adjustment Accuracy Using Atomic Force Microscope in Variably Shaped Electron-Beam Writing Systems", Japanese Journal of Applied Physics, vol. 36, Part 1, No. 12B, pp. 7517-7522, (1997).

Choi, et al., "Requirements of e-beam size and position accuracy for photomask of sub-32 nm HP device", SPIE vol. 7748, Photomask and Next-Generation Lithography Mask Technology XVII, pp. 774819-1-774819-12, (2010).

Park, et al., "Requirements of the e-beam shot quality for mask patterning of the sub-1X device", SPIE vol. 9777, Alternative Lithographic Technologies VIII, pp. 977716-1-977716-8, (2016).

\* cited by examiner

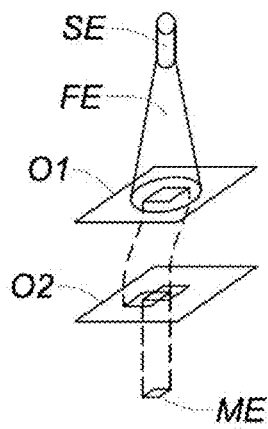 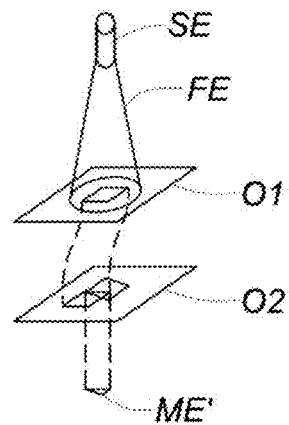
Fig. 1A    Fig. 1B
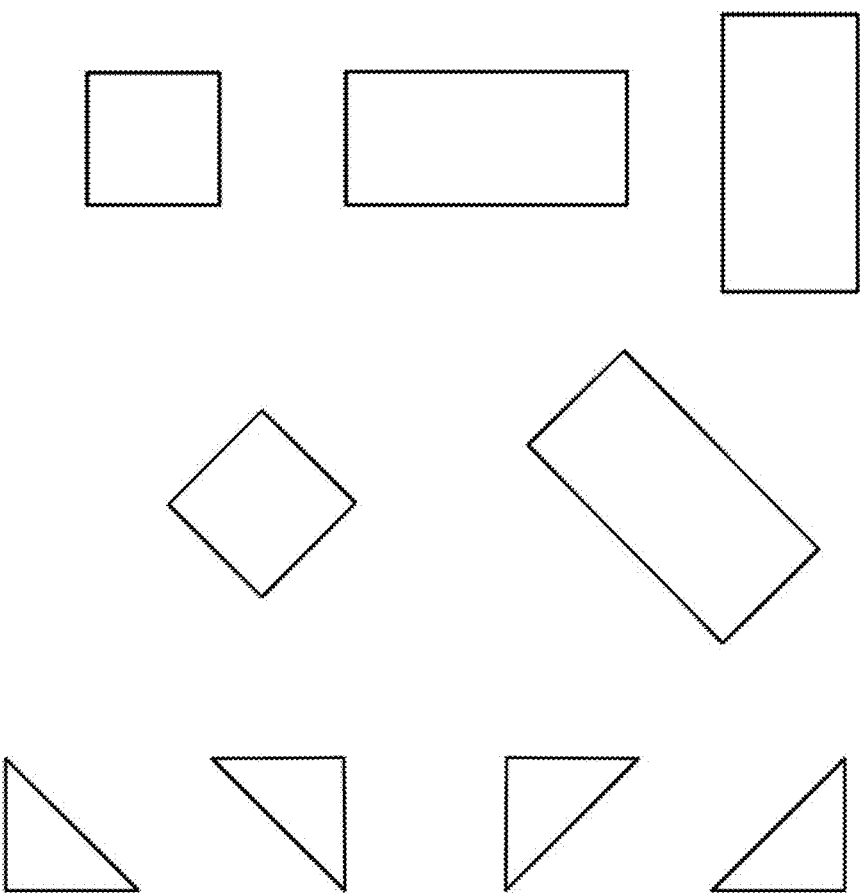
Fig. 2

US 10,573,492 B2

CALIBRATION OF ELEMENTARY SMALL PATTERNS IN VARIABLE-SHAPED-BEAM ELECTRON-BEAM LITHOGRAPHY

CROSS-REFERENCE TO RELATED APPLICATIONS

This application claims priority to foreign French patent application No. FR 1755863, filed on Jun. 27, 2017, the disclosure of which is incorporated by reference in its entirety.

FIELD OF THE INVENTION

The invention relates to a method for calibrating small elementary patterns ("shots") in variable-shaped-beam electron-beam lithography, and to the application of such a calibration to the preparation of electron-beam-lithography data.

BACKGROUND

Electron-beam lithography is used to transfer, to a substrate, with a high resolution, geometric patterns forming a layout. An electron beam is used to expose a resist deposited on the substrate according to the layout to be transferred. The exposed resist undergoes a chemical transformation that allows it to be selectively removed, uncovering certain regions of the substrate that may then be etched or undergo a deposition or an ion implantation (alternatively, it is the unexposed resist that is selectively removed).

The main application of electron-beam lithography is the manufacture of the photolithography masks that are used to produce integrated circuits. Other applications are the direct manufacture of integrated circuits, of photonic or electronic components, and of nanostructures.

The resist may be exposed point by point, by means of a very narrow electron beam, but this takes a lot of time. For this reason, recourse is generally made to another technique, called the variable-shaped-beam (VSB) technique, the principle of which is illustrated in FIGS. 1A, 1B and 2. As may be seen in FIGS. 1A and 1B, a relatively wide electron beam FE, generated by an electron source SE, passes through two successive apertures O1, O2. The shape of the beam after it has passed through the apertures depends on the shape of the latter, which is variable. Thus an elementary pattern (a "shot" is spoken of in the literature) ME, ME', the shape of which approximately corresponds to that of the beam, is obtained, which is transferred, in a single exposure, to the substrate. In the case of FIG. 1A, the elementary pattern ME is square or rectangular; in that of FIG. 1B, the elementary pattern ME' is triangular.

In fact, the shape and dimensions of the elementary pattern actually transferred to the substrate does not correspond exactly to those of the beam, and also depend on nearby patterns (for this reason "proximity effects" are spoken of). This is mainly due to scattering of the electrons in the resist and to backscattering thereof by the substrate.

To determine the pattern actually transferred to the substrate, the following are applied to a "nominal" pattern:

a physical model, which represents the spread of the electrons in the resist, generally by means of a point spread function (PSF), and a model of the resist—generally a simple threshold-based model: the resist is considered to be exposed if the electron dose that it receives exceeds a threshold.

As is known per se, this allows the corrections that must be made to the nominal pattern to ensure the transferred pattern is as close as possible to that desired to be determined. "Data preparation" is spoken of because this operation results in the creation of a data file that is delivered to the VSB machine to control the execution of the lithography process in order to obtain the transfer of the sought-after pattern.

Typically, VSB machines allow rectangular or square, or even right-isosceles-triangle-shaped elementary patterns having an orientation of 0°, ±45° or 90° with respect to a reference direction to be obtained. These various elementary shapes are illustrated in FIG. 2. It will easily be understood that they allow, simply and rapidly, certain patterns, for example lines with these four predefined orientations, to be produced. It may for example be seen in FIGS. 3A and 3B that lines that are horizontal (90° with respect to the vertical reference direction) or at 45° may be obtained from a limited number of elementary patterns having substantially the same critical dimension as the line itself, said dimension being corrected to take into account proximity effects (the "critical dimension" is the smallest dimension of a pattern: the width of a line, the side length of a square, etc.). In contrast, a line having a different orientation must be decomposed into a larger number of elementary patterns that are substantially smaller than its critical dimension (width)—this is illustrated in FIG. 3C.

Now, it is known that when elementary patterns of very small dimensions (typically 100 nm or less) are produced by variable-shaped-beam electron-beam lithography, the dimensions of the patterns actually transferred to the substrate differ from those expected from physical model and model of the resist alone. For example, FIG. 4 shows the critical dimension $CD_m$ (width) measured for a straight line of nominal critical dimension $CD_0$ equal to 120 nm, obtained by VSB electron-beam lithography, as a function of its orientation. It may be verified that the measured critical dimension $CD_m$ differs little from its nominal value, given by a physical model (horizontal line), for an orientation of 0°, 45°, 90°, 135°, because in these cases it is not necessary to use elementary patterns that are smaller than the critical dimension. In contrast, for intermediate orientations, the measured critical dimension of the line may exceed 130 nm, i.e. an error of about 10%.

This effect is known to the scientific literature:

H. C. Pfeiffer et al. "Recent Advances in Electron-Beam Lithography for the High-Volume Production of VLSI devices", IEEE transaction on electron devices, Vol. ED-26 4, 663 (1979);

S. Nishimura et al., "Evaluation of Shaping Gain Adjustment Accuracy Using Atomic Force Microscope in Variably Shaped Electron-Beam Writing Systems", J. Appl. Phys. 36, 7517 (1997);

J. Choi et al., "Requirements of e-beam size and position accuracy for photomask of sub-32 nm HP device", SPIE Vol. 7748, 774819-1 (2010);

S. Park et al., "Requirements of the e-beam shot quality for mask patterning of the sub-1X device", SPIE Vol. 9777, 977716-1 (2016).

However, there is no method allowing the errors associated with the use of "small" elementary patterns, i.e. elementary patterns smaller than the critical dimension of the pattern be transferred, to be systematically and simply corrected.

SUMMARY OF THE INVENTION

The invention aims to overcome this limitation of the prior art. More precisely, it aims to provide a method for calibrating elementary patterns, in variable-shaped-beam electron-beam lithography, that may be used, in the preparation of data, to substantially decrease the errors associated with the use of "small" elementary patterns. It also aims to provide at least one such method for preparing data.

Moreover, the inventors have also realized that the errors associated with the use of "small" elementary patterns unfavourably affects the estimation of the physical model of the spread of electrons (PSF). One embodiment of the invention allows this problem, which has remained overlooked up till now, to be remedied.

One subject of the invention is therefore a method for calibrating elementary patterns in variable-shaped-beam electron-beam lithography, comprising the following steps:

a. producing, by variable-shaped-beam electron-beam lithography, at least one calibration pattern comprising geometric figures each having a nominal critical dimension, said figures being divided into elementary patterns of smaller dimensions than each said nominal critical dimension, the elementary patterns of each geometric figure having dimensions that are identical and those of other geometric figures having different dimensions;

b. measuring the actual critical dimension of each said geometric figure; and c. applying a regression method on the basis of the actual critical dimensions thus determined to construct a mathematical model expressing:

either a variation in dimensions of said elementary patterns, or an error in the exposure dose of said elementary patterns producing an equivalent effect to said variation in dimensions, as a function of the dimensions of the elementary patterns.

According to particular embodiments of such a method:
Said step c. may comprise the following substeps:
c1. determining an expression for said variation in dimensions of said elementary patterns or said dose error as a function of the dimensions of the elementary patterns and of a plurality of parameters to be evaluated;

c2. calculating the values of said parameters to be evaluated by minimizing a function representative of an average deviation between the dimensions measured in step b and those calculated using the expression determined in substep c1.

The geometric figures of a given calibration pattern may be straight lines that are parallel to one another.

Said elementary patterns may be chosen from rectangular patterns and triangular patterns.

Said elementary patterns may be right-isosceles-triangle shaped, and the geometric figures of a given calibration pattern may be straight lines that are parallel to one another and to a right line of said elementary patterns.

Each said geometric shape may be divided into identical elementary patterns that are juxtaposed without overlap.

Said elementary patterns may be right-isosceles-triangle shaped, said geometric figures may be straight lines that are parallel to one another and to a side of the corresponding elementary patterns, and said calibration pattern may comprise:

lines formed from two subassemblies of identical elementary patterns of right-isosceles-triangle shape, said elementary patterns being juxtaposed without overlap, said subassemblies being superposed with a spatial offset; and lines formed from elementary patterns of right-isosceles-triangle shape having complementary orientations, said elementary patterns being juxtaposed without overlap.

Said mathematical model may be a polynomial model.

Another subject of the invention is a method for preparing data for variable-shaped-beam electron-beam lithography, comprising a step of correcting a variation in dimensions of at least one elementary pattern of a layout to be transferred to a substrate by variable-shaped-beam electron-beam lithography, said step being implemented using a mathematical model expressing said variation, or an exposure-dose error producing an effect equivalent to said variation, as a function of the dimensions of said elementary pattern.

According to particular embodiments:
The method for preparing data may comprise a prior step of determining said mathematical model by means of a calibrating method such as defined above.

Said mathematical model may express said variation in dimensions of at least one elementary pattern as a function of its dimensions, the method comprising the following steps:

i. receiving, by way of input datum, a layout to be transferred to a substrate by variable-shaped-beam electron-beam lithography;

ii. dividing said layout into elementary patterns and using a physical model of the spread of the electrons to make a correction to the geometry and/or to the exposure dose of each said elementary pattern;

iii. applying said mathematical model to calculate a variation in dimensions of each said elementary pattern;

iv. calculating, for each said elementary pattern, a corrected exposure dose taking into account the corresponding variation in dimensions; and v. applying the corrected exposure doses calculated in step iv to the corrected elementary patterns, such as determined at the end of step ii.

Said mathematical model may express said variation in dimensions of at least one elementary pattern as a function of its dimensions, the method comprising the following steps:

I. receiving, by way of input datum, a geometric pattern to be transferred to a substrate by variable-shaped-beam electron-beam lithography;

II. dividing said geometric pattern into elementary patterns and using a physical model of the spread of the electrons to make a correction to the geometry and/or exposure dose of each said elementary pattern;

III. applying said mathematical model to calculate a variation in dimensions of each said elementary pattern, and modifying said elementary patterns to correct this variation;

IV. reapplying said mathematical model to recalculate a new variation in dimensions of each said elementary pattern, taking into account the correction made in step III;

V. calculating, for each said elementary pattern, a corrected exposure dose taking into account the corresponding variation in dimensions calculated in step IV; and VI. applying the corrected exposure doses calculated in step V to the elementary patterns such as modified in step III.

Said mathematical model may express an exposure-dose error producing an equivalent effect to a variation in dimensions of at least one elementary electron-beam-lithography pattern as a function of its dimensions, the method comprising a step of correcting said exposure-dose error.

Yet another subject of the invention is a method for transferring a layout to a substrate by variable-shaped-beam electron-beam lithography, comprising:

a step of preparing data, which step is implemented using a method such as defined above; and a step of variable-shaped-beam electron-beam lithography using the elementary-pattern dimensions and exposure doses obtained using said method.

Yet another subject of the invention is a method for estimating a physical model of the spread of electrons in a variable-shaped-beam electron-beam lithography method, comprising:

A. transferring a layout to a substrate by means of said variable-shaped-beam electron-beam lithography method, said layout being composed of a plurality of elementary patterns;

B. estimating said physical model of the spread of electrons by comparing simulated dimensions and measured dimensions of said layout transferred to the substrate;

C. implementing a calibrating method such as defined above to construct a mathematical model expressing a variation in dimensions of said elementary patterns as a function of said dimensions; and D. calculating new simulated dimensions of the layout transferred to the substrate by applying said mathematical model; and steps B. to D. being implemented iteratively.

BRIEF DESCRIPTION OF THE DRAWINGS

Other features, details and advantages of the invention will become apparent on reading the description that is given with reference to the appended drawings, which are given by way of example and show, respectively:

FIGS. 1A and 1B illustrate representations of the principle of Variable Beam Shape lithography;

FIG. 2 illustrates different elementary patterns of various shapes;

DETAILED DESCRIPTION

Figure 3A:
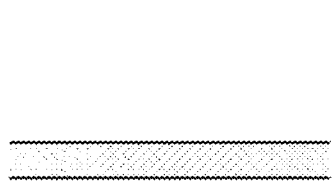
FIGS. 3A, 3B and 3C illustrate the fracturing, according to the prior art, of straight lines having different orientations.
Figure 3B:
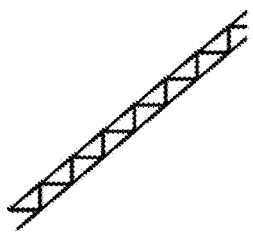
Figure 3C:
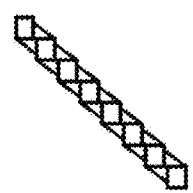
Figure 4:
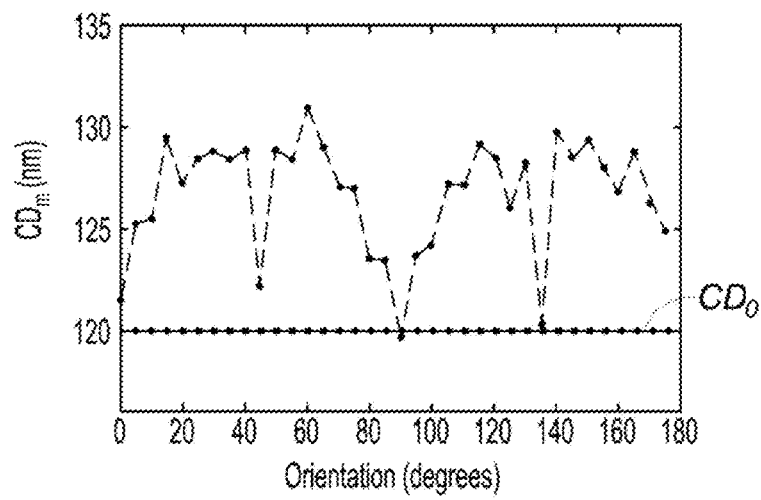
FIG. 4 illustrates a plot of the critical dimension of a line as a function of its orientation.
Figure 5A:
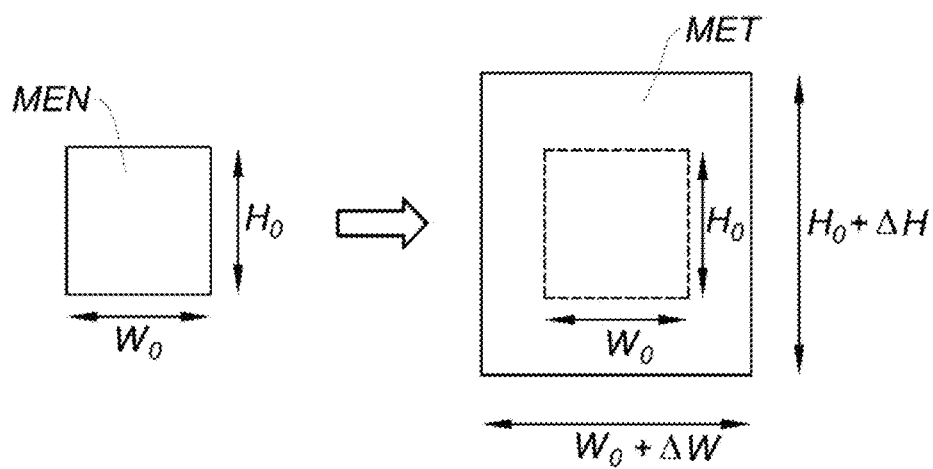
FIGS. 5A, 5B and 5C, dimensional variations of small elementary patterns of various shapes.

The left-hand part of FIG. 5A shows a "nominal" elementary pattern (or "shot") MEN of rectangular shape, the sides of which, perpendicular and parallel to the reference direction ("orientation at 0°") respectively, have lengths $W_0$ and $H_0$. The pattern actually transferred to the substrate, in other words the footprint of the beam on the resist, is designated by the reference MET and has sides of length $W_0+\Delta W_0$ and $H_0+\Delta H_0$. It is assumed that the centre of gravity of the transferred elementary pattern is unchanged with respect to that of the nominal pattern, this being true to a good approximation, but this simplifying assumption may be easily relaxed. The deviations $\Delta W_0$ and $\Delta H_0$ may, in principle, be positive or negative; below, only positive deviations are considered, this meaning that the elementary pattern actually transferred is larger than the corresponding nominal pattern, but this is not essential. What is important is that these deviations depend on the nominal dimensions $W_0$ and $H_0$. Thus it is possible to write:

$$\Delta W_0 = \Delta W(W_0, H_0)$$

$$\Delta H_0 = \Delta H(W_0, H_0) \quad (1)$$

It is assumed that the functions expressing the dimensional deviations as a function of the nominal dimensions depend on a finite number of parameters. For example, the functions $\Delta W(W,H)$ and $\Delta H(W,H)$ may be considered to be polynomials of degree N, and hence it is possible to write:

$$\begin{cases} \Delta W(W_0, H_0) = \sum_{i=0}^{N} \sum_{j=0}^{N-i} \chi_{i,j}^0 H_0^i W_0^j \\ \Delta H(W_0, H_0) = \sum_{i=0}^{N} \sum_{j=0}^{N-i} \Lambda_{i,j}^0 H_0^i W_0^j \end{cases} \quad (2)$$

where $\chi^0$ and $\Lambda^0$ are respectively the two (N×N) matrices of coefficients of the polynomial relationships of degree N, defining what may be called the "elementary-pattern model" for the case of a rectangle of 0° orientation.

Figure 5B:
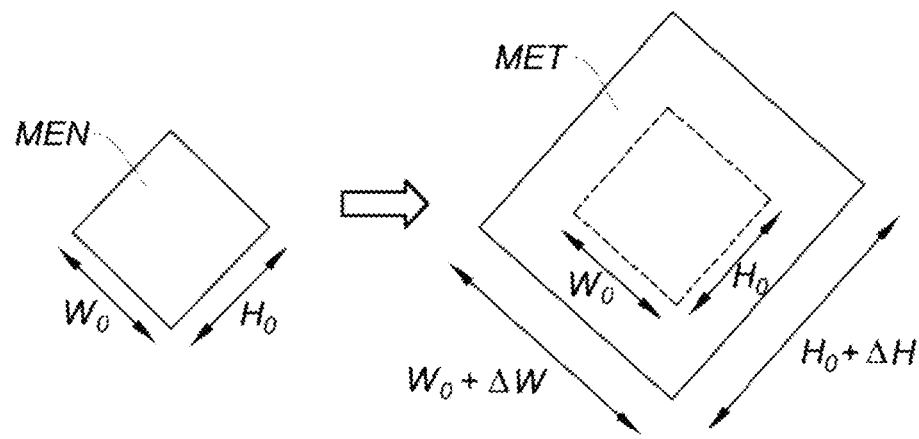

The case of a rectangular elementary pattern oriented at 45° with respect to the reference direction (FIG. 5B) is entirely similar. The corresponding elementary-pattern model is defined by two other N×N matrices: $\chi^{45}$ and $\Lambda^{45}$.

Figure 5C:
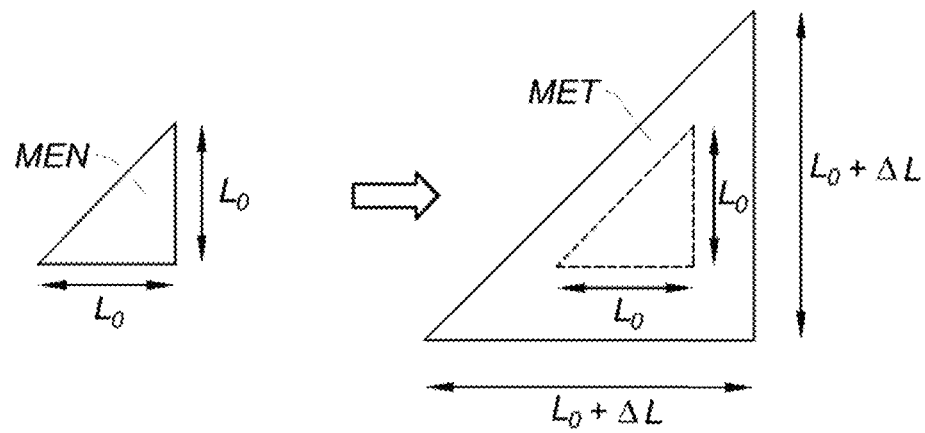

FIG. 5C relates to the case of an elementary pattern of right-isosceles-triangle shape, having a side (right line) of nominal length $L_0$ and of real length $L_0+\Delta L_0$. A polynomial model of order N expressing the dimensional variation $\Delta L_0$ as a function of the nominal dimension $L_0$ may therefore be written:

$$\Delta L(L_0) = \sum_{i=0}^{N} \Gamma_i L_0^i \quad (3)$$

where $\Gamma$ is a vector of coefficients of dimension N. In fact, there are four possible orientations for a triangular elementary pattern (see the bottom part of FIG. 2), it is therefore necessary to define four of these vectors: $\Gamma^1, \Gamma^2, \Gamma^3, \Gamma^4$.

Thus, for a VSB electron-beam-lithography apparatus employing the elementary patterns of FIG. 2, a polynomial model of order N of the small elementary patterns comprises $4N^2+4N$ parameters (4 N×N matrices: $\chi^0, \Lambda^0, \chi^{45}, \Lambda^{45}$ and 4N×1 vectors: $\Gamma^1, \Gamma^2, \Gamma^3, \Gamma^4$). In certain cases, it will be possible to simplify this model, for example by setting $W_0=\Delta W(W_0)$ and $\Delta H_0=\Delta H_0=\Delta H(H_0)$, assumption that decreases the number of parameters to 8N.

The choice of a polynomial model is not exclusive. Moreover, various VSB machines may employ elementary patterns that are different from those of FIG. 2, thereby impacting the structure of the model.

It is also possible to not directly consider the dimensional variations $\Delta W, \Delta H, \Delta L$, but rather equivalent variations $\Delta D$ in the dose D, i.e. dose variations that would indirectly induce the same dimensional variations. In the case of a triangular elementary pattern for example, it is then possible to write:

$$\Delta D(L_0) = \sum_{i=0}^{N} \delta_i L_0^i \quad (4)$$

the parameters $\delta_i$ forming a vector of 8 to N components. The case of rectangular patterns is entirely similar except that, as in Equation 2, the model comprises $N^2$ parameters.

In any case, a model expressing a dimensional variation, or an equivalent dose variation, as a function of the nominal dimensions of an elementary pattern, of its shape and of a finite number of parameters is obtained. The problem of estimating these parameters therefore arises.

To do this, it is necessary to transfer, to the substrate, calibration patterns obtained from elementary patterns the nominal critical dimensions of which are identical within a given calibration pattern. In the embodiments described below, the calibration patterns all have identical nominal critical dimensions, but this is not essential.

Different calibration patterns are used for various elementary patterns.

Figure 6A:
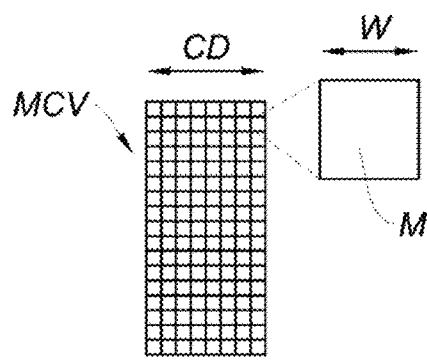
FIGS. 6A, 6B, 6C, 6D and 6E, the division into elementary patterns of various line-shaped calibration patterns.
Figure 6B:
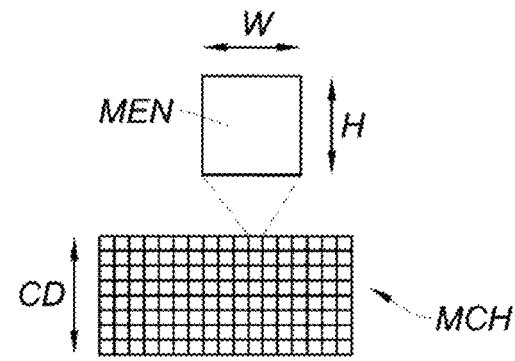

For rectangular elementary patterns with an orientation of "0°" (see FIG. 5A), the calibration patterns are vertical lines MCV or horizontal lines MCH of nominal width (critical dimension) $CD_0$, said lines being divided into identical elementary patterns MEN of dimensions H and W. The nominal width $CD_0$ of each line is an integer multiple of the width (for the vertical lines) or height (for the horizontal lines) of the constituent elementary patterns; in other words, for the calibration patterns MCV: $CD_0=n\cdot W$ and for the calibration patterns MCH: $CD_0=n\cdot H$, n being an integer. The case of a calibration pattern consisting of a vertical line is shown in FIG. 6A, and that of a horizontal-line-shaped pattern in FIG. 6.

Figure 6C:
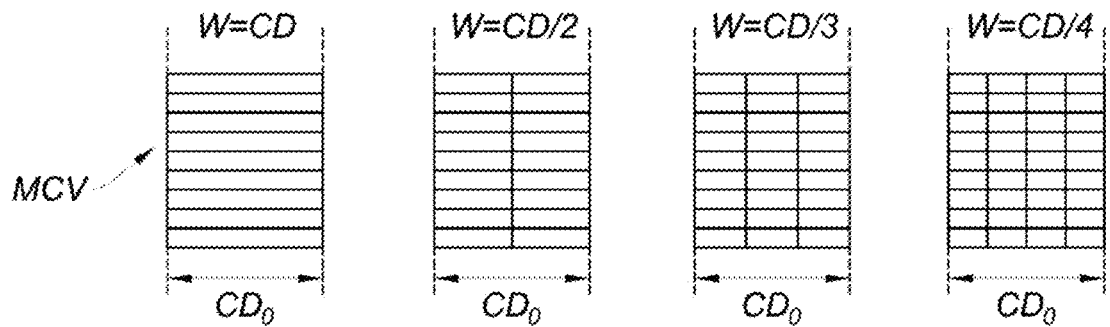
Figure 6D:
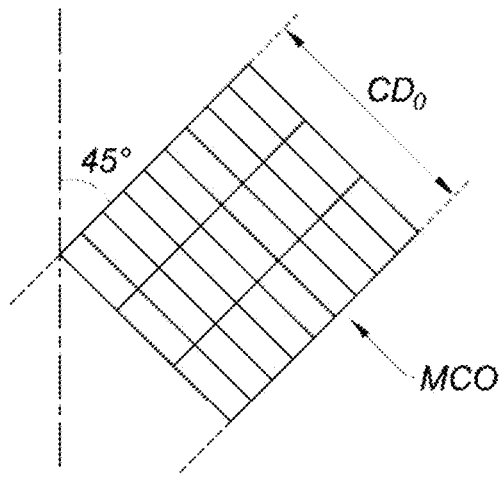

In contrast, the height (H) or width (W) of the elementary patterns of a horizontal or vertical line, respectively, is not subject to any specific quantification constraint. The maximum height and width of the elementary patterns are however limited by the VSB machine. It is advantageous to choose a $CD_0$ value such that the discretization of the width or height of the elementary patterns is as fine as possible. For example, for a $CD_0$ of 120 nm, the integer widths of possible elementary patterns are [120, 60, 40, 30, 24, 20, 15, 12, 10, 8, 6, 5, 4, 3, 2, 1] nm. In practice, elementary patterns the width of which is proportional to the minimum grid pitch of an input layout of the VSB machine will be employed. It will be noted that the larger the $CD_0$ of the calibration pattern, the larger the number of different possible elementary patterns meeting the preceding criteria. FIG. 6C shows, by way of example, a vertical-line-shaped calibration pattern, said pattern being divided into elementary patterns of fixed height and of width W equal to $CD_0$, $CD_0/2$, $CD_0/3$ and $CD_0/4$.

For rectangle-shaped elementary patterns oriented at 45°, line-shaped calibration patterns MCO having the same orientation are used.

Figure 6E:
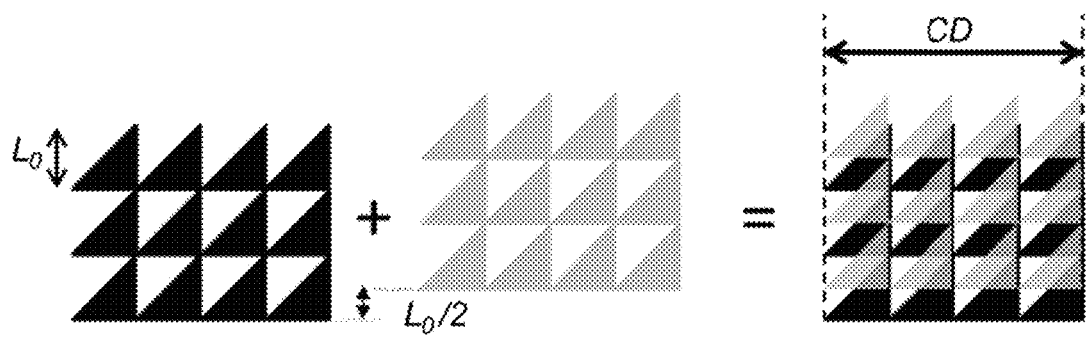
Figure 7A:
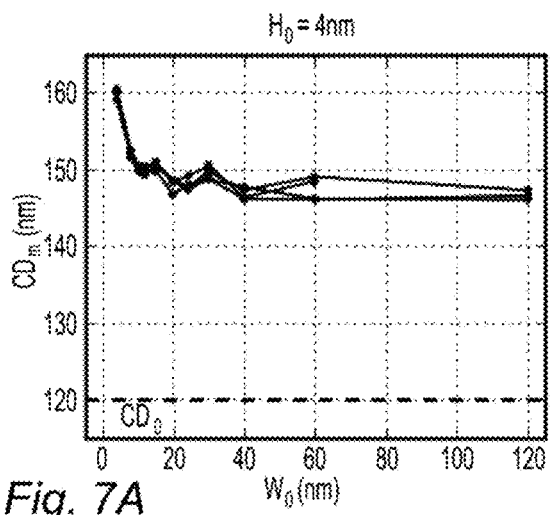
FIGS. 7A, 7B, 7C, 7D and 7E, graphs illustrating the dependency of the critical dimension of a calibration pattern (line) on the dimensions of the elementary patterns from which it is composed.
Figure 7B:
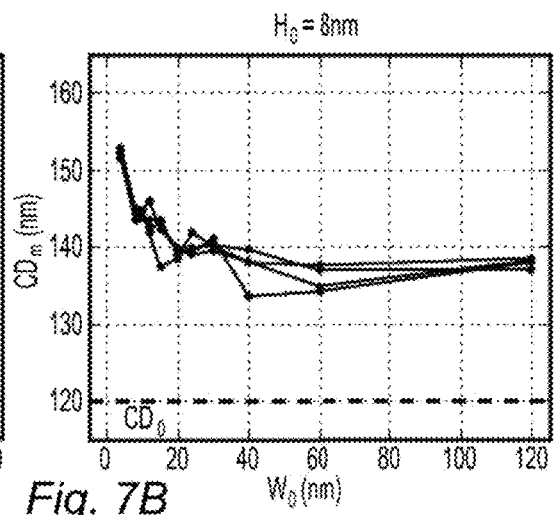
Figure 7C:
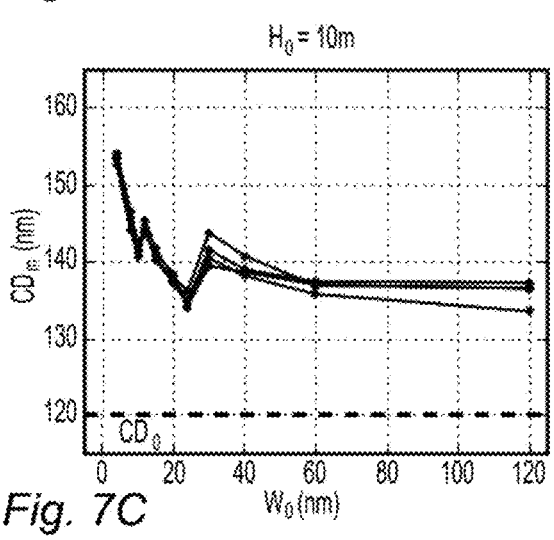
Figure 7D:
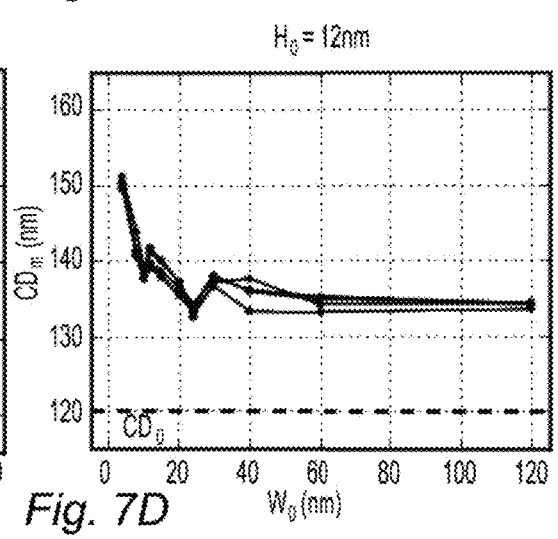
Figure 7E:
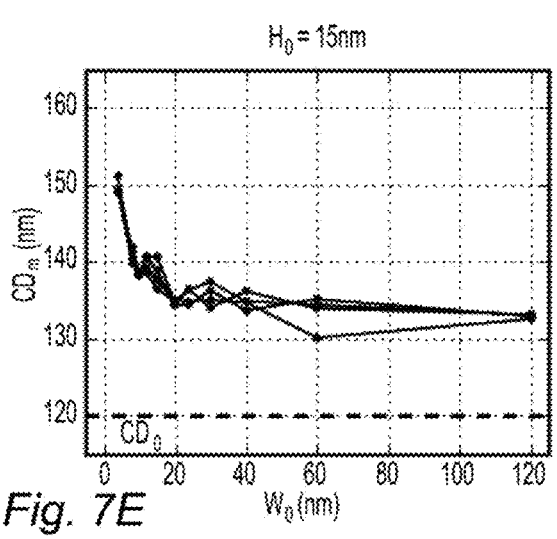

The case of triangle-shaped elementary patterns is more complex. Specifically, a straight line constructed from identically oriented identical right triangles would only be half filled (see the left-hand part of FIG. 6E). The average dose would therefore be half that in the case of rectangular elementary patterns, and this would corrupt the calibration. One possible solution consists in using complementary triangles, but this involves conjointly calibrating the models of distinct elementary patterns. It is therefore preferable to superpose two sub-patterns constructed from identical triangles, which are juxtaposed and offset by a half period, i.e. a length $L_0/2$. This is illustrated in FIG. 6E. Each sub-pattern of identical triangles provides a degree of coverage of 50%, whereas the pattern achieved by superposing the two sub-patterns provides a coverage of 100%. It is also possible to use both approaches conjointly, as will be explained in detail below.

More generally, a calibration pattern comprises lines the direction of which corresponds to an orientation of the elementary patterns producible by the VSB apparatus to be calibrated. Such a line may be constructed solely from elementary patterns of the same type (having the same shape, the same orientation and identical nominal dimensions) or elementary patterns of the same shape and dimensions, but possibly having different, and in particular opposite, orientations.

The calibration patterns are first transferred to the resist, then their actual critical dimensions are measured using known methods, for example electron microscopy or atomic force microscopy. For example, FIGS. 7A to 7E are graphs of the critical dimensions, $CD_m$, measured for vertical-line-shaped calibration patterns of a nominal width $CD_0$ of 120 nm, said patterns being divided into rectangular elementary patterns having heights $H_0$ of 4 nm (FIG. 7A), 8 nm (FIG. 7B), 10 nm (FIG. 7C), 12 nm (FIG. 7D) and 15 nm (FIG. 7E) and various width values $W_0$ comprised between 4 nm and 120 nm. It will be noted that the use of calibration patterns of "large" dimensions, made up of a plurality of "small" elementary patterns, amplifies the dimensional variation that it is sought to calibrate. For example, in the case of a calibration pattern divided into square elementary patterns of 4 nm×4 nm, the error in the critical dimension $\Delta CD=(CD_m-CD_0)$ reaches 160 nm−120 nm=40 nm (i.e. 30%), whereas the width variation $\Delta W_0$ of an isolated elementary pattern would be sub-nanoscale and difficult to quantify. It should not however be believed that if $CD_0=n\cdot W_0$, then $\Delta CD=n\cdot \Delta W_0$. The relationship between $\Delta CD$ and $\Delta W_0$ (or $\Delta H_0$, or $\Delta L_0$) is more complex, because it depends on proximity effects.

The next step of the process for calibrating the small-elementary-pattern model consists in calculating the expected, or "theoretical", critical dimension of the calibration patterns. To do this, it is first necessary to calculate the dose field, i.e. the spatial spread of the electrons; this requires the physical model to be used; next the critical dimension is obtained by applying the resist model.

In principle, the dose field D(r) for a calibration pattern is given by the sum, over all the elementary patterns, of the product of convolution of an elementary pattern $ME_i$ and the point spread function (PSF) (which is assumed to be the same for all the elementary patterns):

$$D(\vec{r})=D_0\Sigma_i\int_{ME_i}d\vec{r_s}PSF(\|\vec{r}-\vec{r_s}\|) \qquad (5)$$

where $D_0$ is the exposure dose of each elementary pattern, and $\vec{r}$ and $\vec{r}_s$ position vectors. When the PSF is expressed by a sum of Gaussian curves (this frequently being the case), its convolution with a rectangular elementary pattern may be calculated analytically. In other cases, a finite-element calculational approach is used, i.e. the convolution integral is estimated by a discrete sum over the sub-elements of each elementary pattern.

More precisely, for a rectangular geometry, each elementary pattern may be divided into virtual sub-elements of area dx·dy. The size of the mesh in question must be chosen such that the variation in the PSF within each cell of the mesh is negligible. In the case where the width or height of an elementary pattern is not a multiple of the grid pitch, the sub-elements located on the borders of the pattern are made smaller in order to prevent them from protruding.

The dose density is written as a double sum over the elementary patterns $ME_i$ and over their sub-elements j:

$$D(\vec{r})=D_0\Sigma_{i,j}ME_{ij}PSF(\|\vec{r}-\vec{r_{ij}}\|) \qquad (6)$$

where $ME_{ij}$ corresponds to the area of sub-element j of the elementary pattern i and $\vec{r_{ij}}$ the position vector of a point of this sub-element taken as origin. In the case of a triangular elementary pattern, the dose field may be calculated numerically by discretization of the elementary pattern into triangular or rectangular sub-elements the characteristic size of which is small with respect to the variation in the PSF.

Once the dose field has been calculated, the resist model is applied. The latter is more often than not of the threshold type; it is then a question of determining the outline defined by $D(\vec{r})=D_{threshold}$, where $D_{threshold}$ is the exposure threshold, above which the resist is considered to be perfectly exposed.

Because of the division of the calibration pattern, this outline is generally not straight, but presents undulations; the theoretical critical dimension $CD_{theo}$ is therefore obtained by calculating the average width of the pattern over the entire length of the line (or, at least, over a length much larger than the scale of the undulations).

In the calculation of the theoretical critical dimension $CD_{theo}$, it is not necessary to limit consideration to the nominal elementary patterns, but to apply thereto the dimensional variations introduced by the small-elementary-pattern model to be calibrated, in order to find, via a regression method, the optimal values of the parameters of this model—i.e. those that minimize the deviation between the theoretical and measured critical dimensions. More precisely, the calculation of $CD_{theo}$ must be repeated for all the nominal dimensions of the elementary patterns used in the experimental part of the calibration method and, for each nominal dimension or combination of nominal dimensions (for example $W_0$ and $H_0$), various values attributed to the parameters of the small-elementary-pattern model. Thus, in the case of rectangular elementary patterns, for each pair of nominal dimensions ($W_0$, $H_0$) used to produce the calibration patterns, it is necessary to explore the parameter space ($\chi$, $\Lambda$), to calculate the dimensional variations $\Delta W$, $\Delta H$ corresponding to each set of parameters, and then the corresponding critical dimension $CD_{theo}$. Most often, a complete sampling of the parameter space would to be too costly in terms of calculation time. Thus, preferably, conventional methods, such as a gradient-descent algorithm, will be used to partially and optimally scan this space (for example, in the case of a gradient-descent approach only parameters in the vicinity of a convergence path are taken into account).

Typically, a cost function such as an average quadratic error is minimized. In the case of rectangular elementary patterns, the calibration then consists in finding the matrices of coefficients $\chi$ and $\Lambda$ that minimize:

$$f_{rectangle} = \sum_i \qquad (7)$$

$$|CD_{theo}(W_i^0 + \Delta W_i(W_i^0, H_i^0), H_i^0 + \Delta H_i(W_i^0, H_i^0)) - CD_m(W_i, H_i)|^2.$$

where the index i designates an elementary pattern of a specific calibration pattern.

The polynomial relationships of the model may be constrained on the basis of physical considerations, thereby allowing the optimization problem to be better framed:

As was mentioned above, it may be assumed that the variation $\Delta W$ does not depend on the height H of the elementary patterns but on W alone. The same reasoning may be applied to $\Delta H$ which does not depend on W but on H alone. Thus:

$$\begin{cases} \Delta W(W_0) = \sum_{j=0}^{N} \chi_j W_0^j \\ \Delta H(H_0) = \sum_{i=0}^{N} \Lambda_i H_0^i \end{cases} \qquad (8)$$

The model relates to small elementary patterns. There is therefore a reference size $W_{ref} \times H_{ref}$ from which the measured critical dimension is entirely explained by the physical model. It is therefore possible to consider that for a size $W_0 \geq W_{ref}$ and $H_0 \geq H_{ref}$, the variations $\Delta W$ and $\Delta H$ are zero.

An additional constraint amounts to setting the derivative of the relationships $\Delta W(W_0)$ and $\Delta H(H_0)$ to zero at the reference sizes $W_{ref}$ and $H_{ref}$.

For triangular patterns, it is possible to proceed in an entirely equivalent way using the calibration pattern of FIG. 6E. It is also possible to conjointly calibrate pairs of complementary patterns, for example (right isosceles triangle with the right angle at the bottom left-right isosceles triangle with the right angle at the top right). To do this, two calibration patterns of the type in FIG. 6E are produced for the two kinds of triangles, and an additional pattern using pairs of complementary triangles forms squares. Thus, three elementary cost functions are obtained that are summed, optionally after weighting, in order to find an overall cost function the minimization of which delivers two vectors of parameters $\Gamma^1$, $\Gamma^2$. The same procedure may be applied to extract the vectors of parameters $\Gamma^3$, $\Gamma^4$ associated with the two other complementary triangular patterns.

The case of an elementary-pattern model that is expressed in terms of dimensional variations is considered here. In the case of a model expressed in terms of dose variation (Equation (4)), it is enough to replace, in the Equation (5) or (6), the dose value $D_0$ with that delivered by the elementary-pattern model and expressed as a function of the parameters to be determined.

Figure 8A:
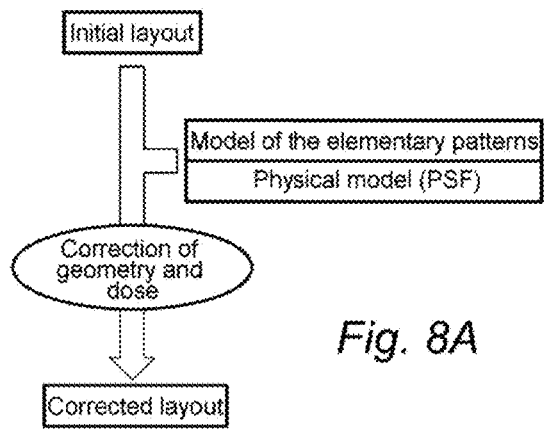
FIGS. 8A, 8B and 8C, flow charts of various methods for preparing data according to embodiments of the invention.

FIG. 8A illustrates, in a very general way, a method for preparing data according to one embodiment of the invention. This method is implemented by computer. The data provided as input define the layout to be transferred, which for example corresponds to a photolithography mask for producing an integrated circuit. As was explained above, if this "nominal" layout is used directly to control the VSB machine, the desired result would not be obtained, on the one hand because of proximity effects, and on the other hand, in certain cases, because of effects related to the division into small elementary patterns. It is therefore necessary to apply geometry and exposure-dose corrections to obtain a corrected layout. This corrected layout differs from the nominal layout but is such that, when it is used to control the VSB machine, the "actual" layout transferred to the substrate is a good approximation (ideally, the best possible approximation) of the nominal layout provided as input. These corrections are calculated by applying a physical model to correct proximity effects (this being conventional) and a small-elementary-pattern model (this being the contribution of the present invention).

When the small-elementary-pattern model is expressed in terms of dose variation (Equation (4)), it delivers directly a dose correction that must be taken into account in the application of the physical model. More precisely, for each elementary pattern, the dose actually applied via the small-elementary-pattern model is $D_0+\Delta D$, $\Delta D$ depending on geometric parameters. To correct this effect it is therefore enough to assign, to each elementary pattern, the dose $D_0 - \Delta D$.

The case of a small-elementary-pattern model that is expressed in terms of dimensional variations (Equations (2) and (3)) is more complex. Two embodiments will be described with reference to FIGS. 8B and 8C.

Figure 8B:
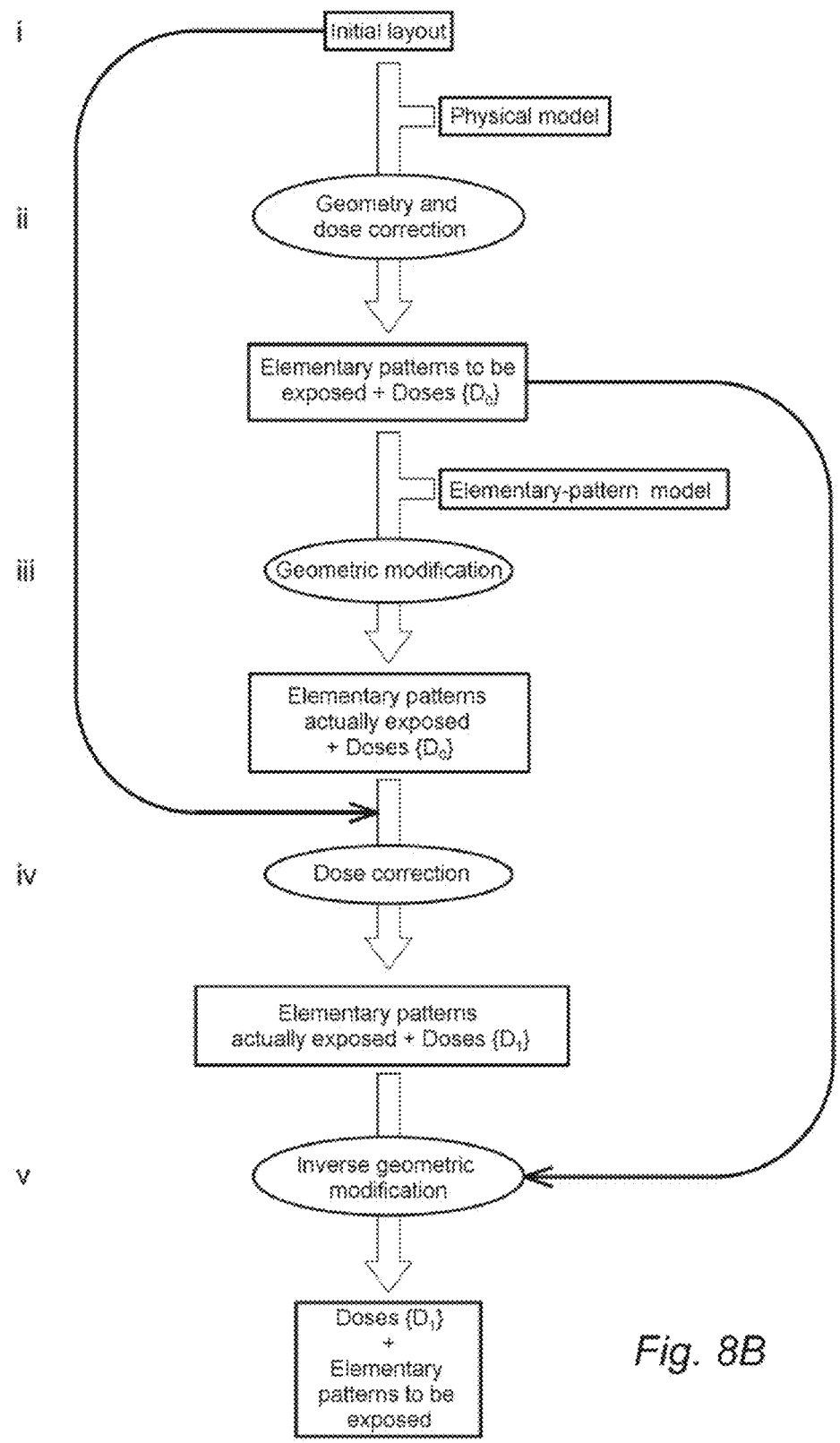

In the embodiment in FIG. 8B:

A computer file describing the layout to be transferred to a substrate is delivered as input datum (step i).

The patterns from which this layout is formed are divided into elementary patterns having predefined nominal dimensions, and the physical model is used, in an entirely conventional way, to make a first geometry and dose correction (step ii). This correction leads to a corrected layout consisting of a set of patterns to be exposed the dimensions of which differ from those of the "nominal" patterns provided as input, and to a dose distribution $\{D_0\}$ associated with each elementary pattern.

The elementary-pattern model is then applied, so as to determine the geometry of the patterns that are actually exposed (step iii).

The geometric modifications affect the dose distribution in a way that may be calculated (step iv). The "actual" dose $D_1$ of an elementary pattern may be related to the initial dose $D_0$ by the law of conservation of energy: $D_1 = D_0(S_0/S_1)$, where $S_0/S_1$ corresponds to the ratio of the areas of an initial elementary pattern (taking into account only corrections intended to compensate for proximity effects) and the same pattern such as modified in step iii.

This law of conservation of energy is natural in order to keep long-range proximity effects unchanged. Specifically, the dose field far from the elementary pattern in question is the same in the case of a change of geometry or dose respecting the equation of conservation of energy. In contrast, for structures that are small with respect to the spatial variation in the PSF, for example contact-type structures, simply applying the law of conservation of energy does not achieve satisfactory results. It is therefore necessary to have recourse to a global correction taking into account neighbouring elementary patterns. This global correction of the dose of the elementary patterns may be carried out in step iv). It may use an algorithm similar to that implemented in step ii), but modifying only the dose and leaving the geometry unchanged.

The last step (v) consists in applying the dose $D_1$ to the elementary patterns "to be exposed", i.e. the patterns determined in step ii. Formally, this consists in carrying out a geometric transformation that is the inverse of that applied in step iii, but in practice it is not necessary to calculate this transformation because the target geometry is already known.

Figure 8C:
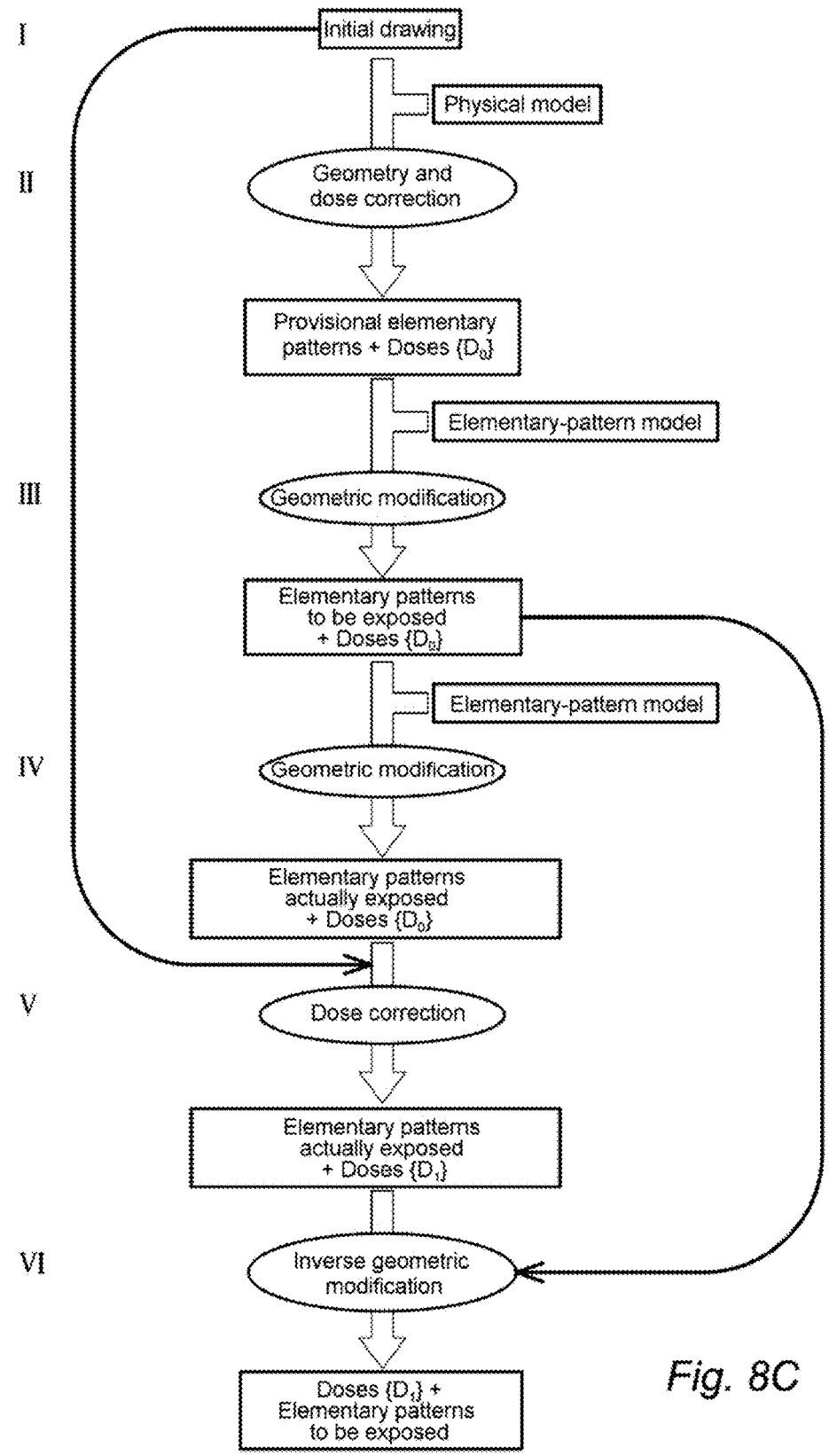

The method of FIG. 8C differs from that of FIG. 8B in that it comprises a step (reference III in the figure) of pre-compensating for the effects of small elementary patterns. In this method:

A computer file describing the layout to be transferred to the substrate is provided as input datum (step I, equivalent to step i of the method of FIG. 8B).

The layout to be transferred is divided into elementary patterns and the physical model is used, in an entirely conventional way, to make a first correction of geometry and dose (step II, equivalent to step ii of the method of FIG. 8B). This correction leads to a layout consisting of a set of elementary patterns the dimensions of which differ from those of the "nominal" patterns provided as input, and to a dose distribution $\{D_0\}$ associated with each elementary pattern. However, these elementary patterns are not those that will actually be used to carry out the lithography; they may be qualified "provisional" elementary patterns.

The elementary-pattern model is used to calculate and to apply a correction to the provisional elementary patterns, so as to obtain the patterns to be exposed (step III). Typically, if a "provisional" elementary pattern has a dimension $H_0$, a corrected elementary pattern ("to be transferred") of dimension $H_0 - \Delta H_0$ will be used, such that the dimension of the pattern actually transferred to the substrate, which dimension is given by the elementary-pattern model, will be $H_0$. In practice, the dimension $H_0 - \Delta H_0$ of the corrected elementary pattern is rounded to the closest multiple of the minimum grid pitch of an input layout of the VSB machine.

Next, the elementary-pattern model is applied, so as to determine the geometry of the patterns that will actually be exposed (step IV, equivalent to step iii of the method of FIG. 8B, unless the elementary patterns used are pre-corrected).

At this point, the actual dose $D_1$ is calculated as in step iv of the method of FIG. 8B (IV).

Next, this dose $D_1$ is applied to the patterns determined in step III (VI).

In a VSB machine, the input data may be re-divided at the borders of the field zones of the machine. In a standard data-preparation flow, based only on a PSF model, this step of post-division does not adversely affect the correction. In contrast, in the case of the small-elementary-pattern model, the post-division of the elementary patterns may lead to correction errors. It is therefore preferable to take into account this "machine division". This may be done by introducing a correction "in advance", which correction is integrated into step ii) of the method of FIG. 8B or step III) of the method of FIG. 8C.

The method for preparing data of FIG. 8A (FIGS. 8B and 8C being particular embodiments thereof) requires a physical model of the spread of electrons, which is expressed by a point spread function (PSF), to be taken into account. As is known per se, the PSF is determined by calibration on the basis of patterns produced by VSB lithography. However these patterns, above all when they are of small size, may be affected by the dimensional variations discussed above. At present, this is not taken into account. Thus, the effects of the small elementary patterns induce errors in the estimation of the PSF. In turn, these errors affect the precision of the calibration of the parameters of the elementary-pattern model. In conclusion, the two models used to calculate the geometry and dose corrections in a method of the type illustrated in FIG. 8A are affected by errors. This has a tendency to increase the deviation between the pattern actually transferred to the substrate and the "nominal", or "target", pattern.

Figure 9:
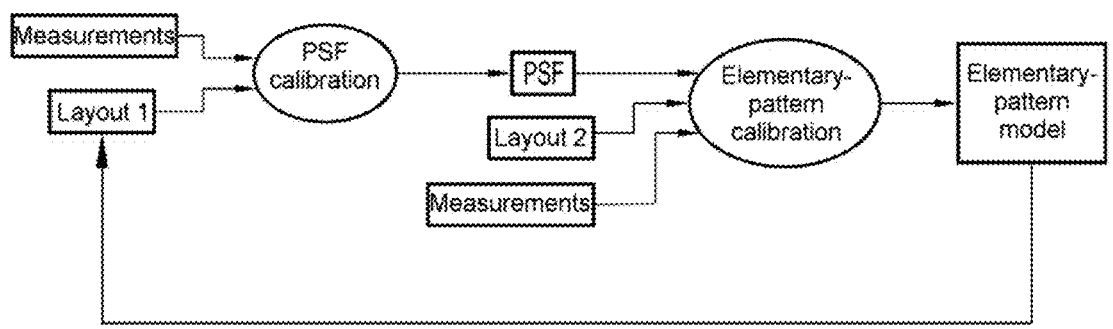
FIG. 9 a flowchart of an iterative method for estimating a physical model of the spread of electrons according to another embodiment of the invention.

To mitigate this drawback, the invention proposes to perform an iterative estimation of the PSF, as illustrated in FIG. 9.

Firstly, the PSF is estimated conventionally, by comparing the simulation of a "nominal" first calibration layout (layout 1) with measurements taken on the layout actually transferred to a substrate. The PSF thus obtained is used to carry out a calibration of the elementary-pattern model as was described in detail above, using a second calibration layout (layout 2). The elementary-pattern model thus obtained is applied to the first calibration layout. The first calibration layout modified to take into account the effects of the small elementary patterns is used to calculate a new estimation of the PSF, and so on until convergence.

Once the data have been prepared, the pattern is transferred to the substrate in a conventional way, using the geometries and doses calculated according to the invention.

The invention claimed is:

1. A method for calibrating elementary patterns in variable-shaped-beam electron-beam lithography, comprising the following steps:
   a. producing, by variable-shaped-beam electron-beam lithography, at least one calibration pattern comprising geometric figures each having a nominal critical dimension, said figures being divided into elementary patterns of smaller dimensions than each said nominal critical dimension, the elementary patterns of each geometric figure having dimensions that are identical and those of other geometric figures having different dimensions;
   b. measuring an actual critical dimension of each said geometric figure; and
   c. applying a regression method on the basis of the actual critical dimensions thus determined to construct a mathematical model expressing:
      either a variation in dimensions of said elementary patterns,
      or an error in the exposure dose of said elementary patterns producing an equivalent effect to said variation in dimensions, as a function of the dimensions of the elementary patterns.

2. The method according to claim 1, wherein said step c. comprises the following substeps:
   c1. determining an expression for said variation in dimensions of said elementary patterns or said dose error as a function of the dimensions of the elementary patterns and of a plurality of parameters to be evaluated;
   c2. calculating the values of said parameters to be evaluated by minimizing a function representative of an average deviation between the dimensions measured in step b and those calculated using the expression determined in substep c1.

3. A method for estimating a physical model of the spread of electrons in a variable-shaped-beam electron-beam lithography method, comprising:
   A. transferring a layout to a substrate by means of said variable-shaped-beam electron-beam lithography method, said layout being composed of a plurality of elementary patterns;
   B. estimating said physical model of the spread of electrons by comparing simulated dimensions and measured dimensions of said layout transferred to the substrate;
   C. implementing a calibrating method according to claim 2 to construct a mathematical model expressing a variation in dimensions of said elementary patterns as a function of said dimensions; and
   D. calculating new simulated dimensions of the layout transferred to the substrate by applying said mathematical model; and steps B to D being implemented iteratively.

4. The method according to claim 1, wherein the geometric figures of a given calibration pattern are straight lines that are parallel to one another.

5. The method according to claim 1, wherein said elementary patterns are chosen from rectangular patterns and triangular patterns.

6. The method according to claim 1, wherein said elementary patterns are right-isosceles-triangle shaped, and wherein the geometric figures of a given calibration pattern are straight lines that are parallel to one another and to a right line of said elementary patterns.

7. The method according to claim 1, wherein each said geometric shape is divided into identical elementary patterns that are juxtaposed without overlap.

8. The method according to claim 1, wherein said elementary patterns are right-isosceles-triangle shaped, said geometric figures are straight lines that are parallel to one another and to a side of the corresponding elementary patterns, and said calibration pattern comprises:
   lines formed from two subassemblies of identical elementary patterns of right-isosceles-triangle shape, said elementary patterns being juxtaposed without overlap, said subassemblies being superposed with a spatial offset; and
   lines formed from elementary patterns of right-isosceles-triangle shape having complementary orientations, said elementary patterns being juxtaposed without overlap.

9. The method according to claim 1, wherein said mathematical model is a polynomial model.

10. A method for preparing data for variable-shaped-beam electron-beam lithography, comprising a step of correcting a variation in dimensions of at least one elementary pattern of a layout to be transferred to a substrate by variable-shaped-beam electron-beam lithography, said step being implemented using a mathematical model expressing said variation, or an exposure-dose error producing an effect equivalent to said variation, as a function of the dimensions of said elementary pattern.

11. The method for preparing data for variable-shaped-beam electron-beam lithography according to claim 10, comprising a prior step of determining said mathematical model by the method for calibrating elementary patterns in variable-shaped-beam electron-beam lithography, comprising the following steps:
   a. producing, by variable-shaped-beam electron-beam lithography, at least one calibration pattern comprising geometric figures each having a nominal critical dimension, said figures being divided into elementary patterns of smaller dimensions than each said nominal critical dimension, the elementary patterns of each geometric figure having dimensions that are identical and those of other geometric figures having different dimensions;
   b. measuring the actual critical dimension of each said geometric figure; and
   c. applying a regression method on the basis of the actual critical dimensions thus determined to construct a mathematical model expressing:
   either a variation in dimensions of said elementary patterns,
   or an error in the exposure dose of said elementary patterns producing an equivalent effect to said variation in dimensions, as a function of the dimensions of the elementary patterns.

12. The method for preparing data for variable-shaped-beam electron-beam lithography according to claim 10, wherein said mathematical model expresses said variation in dimensions of at least one elementary pattern as a function of its dimensions, the method comprising the following steps:
   i. receiving, by way of input datum, a layout to be transferred to a substrate by variable-shaped-beam electron-beam lithography;
   ii. dividing said layout into elementary patterns and using a physical model of the spread of the electrons to make a correction to the geometry and/or to the exposure dose of each said elementary pattern;

iii. applying said mathematical model to calculate a variation in dimensions of each said elementary pattern;

iv. calculating, for each said elementary pattern, a corrected exposure dose taking into account the corresponding variation in dimensions; and v. applying the corrected exposure doses calculated in step iv to the corrected elementary patterns, such as determined at the end of step ii.

13. The method for preparing data for variable-shaped-beam electron-beam lithography according to claim 10, wherein said mathematical model expresses said variation in dimensions of at least one elementary pattern as a function of its dimensions, the method comprising the following steps:

I. receiving, by way of input datum, a geometric pattern to be transferred to a substrate by variable-shaped-beam electron-beam lithography;

II. dividing said geometric pattern into elementary patterns and using a physical model of the spread of the electrons to make a correction to the geometry and/or exposure dose of each said elementary pattern;

III. applying said mathematical model to calculate a variation in dimensions of each said elementary pattern, and modifying said elementary patterns to correct this variation;

IV. reapplying said mathematical model to recalculate a new variation in dimensions of each said elementary pattern, taking into account the correction made in step III;

V. calculating, for each said elementary pattern, a corrected exposure dose taking into account the corresponding variation in dimensions calculated in step IV; and VI. applying the corrected exposure doses calculated in step V to the elementary patterns such as modified in step III.

14. The method for preparing data for variable-shaped-beam electron-beam lithography according to claim 10, wherein said mathematical model expresses an exposure-dose error producing an equivalent effect to a variation in dimensions of at least one elementary electron-beam-lithography pattern as a function of its dimensions, the method comprising a step of correcting said exposure-dose error.

15. A method for transferring a layout to a substrate by variable-shaped-beam electron-beam lithography, comprising:

a step of preparing data, which step is implemented using a method according to claim 10; and a step of variable-shaped-beam electron-beam lithography using the elementary-pattern dimensions and exposure doses obtained using said method.

* * * * *